(12) United States Patent
Nedalgi

(10) Patent No.: US 8,330,491 B2
(45) Date of Patent: Dec. 11, 2012

(54) ELECTRONIC DEVICE WITH A HIGH VOLTAGE TOLERANT UNIT

(75) Inventor: Dharmaray M. Nedalgi, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/532,201

(22) PCT Filed: Mar. 26, 2008

(86) PCT No.: PCT/IB2008/051123
§ 371 (c)(1),
(2), (4) Date: Sep. 21, 2009

(87) PCT Pub. No.: WO2008/117247
PCT Pub. Date: Oct. 2, 2008

(65) Prior Publication Data
US 2010/0085080 A1 Apr. 8, 2010

(30) Foreign Application Priority Data
Mar. 28, 2007 (EP) .................... 07105143

(51) Int. Cl.
*H03K 19/0175* (2006.01)
*H03K 19/20* (2006.01)
*H03K 19/094* (2006.01)
*H03K 3/00* (2006.01)
*H03K 5/08* (2006.01)
*H03B 1/00* (2006.01)

(52) U.S. Cl. ............ 326/81; 326/113; 327/108; 327/310

(58) Field of Classification Search ............... 326/81.57, 326/56, 21, 80, 58, 33, 14, 82, 83, 86, 87, 326/113; 327/161, 437, 365, 427, 321, 310, 327/108, 312, 313, 391, 112; 361/91.1, 88
See application file for complete search history.

(56) References Cited

U.S. PATENT DOCUMENTS
5,825,206 A 10/1998 Krishnamurthy et al.
(Continued)

FOREIGN PATENT DOCUMENTS
EP 1050968 B 11/2000

OTHER PUBLICATIONS
EPO, Communication pursuant to Article 94(3) EPC dated Mar. 10, 2010 for European patent application No. 08 719 837.0.
(Continued)

*Primary Examiner* — Shawki S Ismail
*Assistant Examiner* — Dylan White
(74) *Attorney, Agent, or Firm* — Fenwick & West LLP

(57) ABSTRACT

An electronic device is provided with a high-voltage tolerant circuit. The high-voltage tolerant circuit comprises an input terminal for receiving an input signal ($V_{IN}$), a first node (A) and a second node (B), wherein the second node (B) is coupled to an input of a receiver (R). The high-voltage tolerant circuit furthermore comprises a first NMOS transistor (N1) and a first PMOS transistor (P1) coupled in parallel between the input terminal and the second node(B). Furthermore, a second PMOS transistor (P2) is coupled between the input terminal and node A and a second NMOS transistor is coupled with one of its terminals to the first node. The gate of the first NMOS transistor (N2) is coupled to a supply voltage (VDDE). The gate of the first PMOS transistor (P1) is coupled to the first node (A). The gate of the second NMOS transistor (N2) and the gate of the second PMOS transistor (P2) are coupled to the supply voltage (VDDE).

18 Claims, 4 Drawing Sheets

U.S. PATENT DOCUMENTS

| | | | |
|---|---|---|---|
| 6,031,393 A * | 2/2000 | Wayner | 326/81 |
| 6,150,843 A | 11/2000 | Shiffer et al. | |
| 6,577,163 B1 * | 6/2003 | Waldrip et al. | 326/81 |
| 6,768,339 B2 | 7/2004 | Von Thun et al. | |
| 6,771,113 B1 | 8/2004 | Von Thun et al. | |
| 6,809,574 B1 | 10/2004 | Kiani | |
| 7,468,616 B1 * | 12/2008 | Kondapalli et al. | 326/82 |
| 7,564,287 B2 * | 7/2009 | Chen | 327/310 |
| 2003/0062924 A1 | 4/2003 | Wyland | |
| 2004/0046598 A1 * | 3/2004 | Fotouhi et al. | 327/321 |
| 2007/0019348 A1 * | 1/2007 | Bhattacharya et al. | 361/91.1 |
| 2009/0062924 A1 * | 3/2009 | Kito et al. | 623/20.21 |
| 2009/0309647 A1 * | 12/2009 | Lim et al. | 327/437 |

OTHER PUBLICATIONS

Chinese First Office Action, Chinese Application No. 200880009746.1, May 25, 2011, 4 pages.

European Summons to Attend Oral Proceedings Pursuant to Rule 115(1) EPC, European Application No. 08719837.0, Mar. 14, 2011, 4 pages.

PCT International Search Report, PCT Application No. PCT/IB2008/051123, Oct. 2, 2008, 4 pages.

PCT Written Opinion, PCT Application No. PCT/IB2008/051123, Oct. 2, 2008, 4 pages.

* cited by examiner

US 8,330,491 B2

ELECTRONIC DEVICE WITH A HIGH VOLTAGE TOLERANT UNIT

FIELD OF THE INVENTION

The present invention relates to an electronic device with a high voltage tolerant unit.

BACKGROUND OF THE INVENTION

Novel electronic devices typically comprise several voltage domains with different supply voltage levels. These different voltage domains however need to communicate with each other. Some of the circuits may operate at a power supply level of 1.8 V or below. Accordingly, a circuit is required which can interface the two different voltage domains and which can tolerate a high voltage but which can also operate at lower supply voltages.

Typically, a native pass gate with its gate coupled to a supply voltage VDD limits the input voltage to the supply voltage VDD and passes an input signal to a receiver with input swings of up to VDD. For example, a native NMOS transistor comprises a significantly smaller threshold voltage (0-0.2 V) than a typical NMOS transistor (0.6 V). Due to body effects, the threshold voltage may even be larger, i.e. 0.4 V for a native transistor and 0.9 V for a typical transistor. In other words, a native device can pass voltages from VDD (VDD–$V_{TH}$) to VSS. However, it should be noted that native devices are not available in all process technologies in the semiconductor industry. It should also be noted that a native device may add a significant additional cost to the cost of the device.

U.S. Pat. No. 6,768,339 B2 describes a 5 V tolerant input scheme with a switch CMOS pass gate. However, such an implementation is complex and requires a lot of area, and additional control signals are required which also introduce additional cost. Under certain conditions, a static current flow from VDD to VSS may be present, which may create a short between VDD and VSS and is thus not power efficient.

U.S. Pat. No. 6,771,113 B1 discloses a 5 V tolerant and fail-safe input circuit based on a source follower configuration to provide a high voltage tolerant circuit. However, because of the source follower and the resistor configuration, a constant static current is present in the circuit, i.e. the circuit is not power efficient.

SUMMARY OF THE INVENTION

It is an object of the present invention to provide an improved electronic device with a high voltage tolerant unit which can also be operated at lower supply voltage levels.

This object is solved by an electronic device according to claim 1.

Therefore, an electronic device is provided which comprises a high-voltage tolerant circuit. The high-voltage tolerant circuit comprises an input terminal for receiving an input signal, a first node and a second node, wherein the second node is coupled to an input of a receiver. The high-voltage tolerant circuit furthermore comprises a first NMOS transistor and a first PMOS transistor coupled in parallel between the input terminal and the second node. Furthermore, a second PMOS transistor is coupled between the input terminal and node A and a second NMOS transistor is coupled with one of its terminals to the first node. The gate of the first NMOS transistor is coupled to a supply voltage. The gate of the first PMOS transistor is coupled to the first node. The gate of the second NMOS transistor and the gate of the second PMOS transistor are coupled to the supply voltage.

According to an aspect of the invention, the substrates of the first and second NMOS transistor are coupled to VSS. The substrates of the first and second PMOS transistor are coupled to the input terminal.

According to a further aspect of the invention, a third NMOS transistor is coupled to the supply voltage and a second node. The gate of the third NMOS transistor is coupled to the input terminal. The second terminal of the second NMOS transistor is coupled to the second node.

According to still a further aspect of the invention, the third NMOS transistor is coupled between the supply voltage and the second node. The gate of the third NMOS transistor is coupled to the input terminal. According to still a further aspect of the invention, a second terminal of the second NMOS transistor is coupled to the output of the receiver.

The invention relates to the idea to provide a high voltage protecting circuit which can provide a low voltage interface circuit being high voltage tolerant, which is functional at different voltage levels without significant leakage current and/or which can be implemented in a process technology with no native devices to reduce the manufacturing cost. The electronic device according to the present invention is more power efficient due to a lack of static current, is simpler to implement and is more area efficient.

BRIEF DESCRIPTION OF THE DRAWINGS

The advantages and embodiments of the invention will now be described in more detail with reference to the drawings.

DETAILED DESCRIPTION OF EMBODIMENTS

Figure 1:
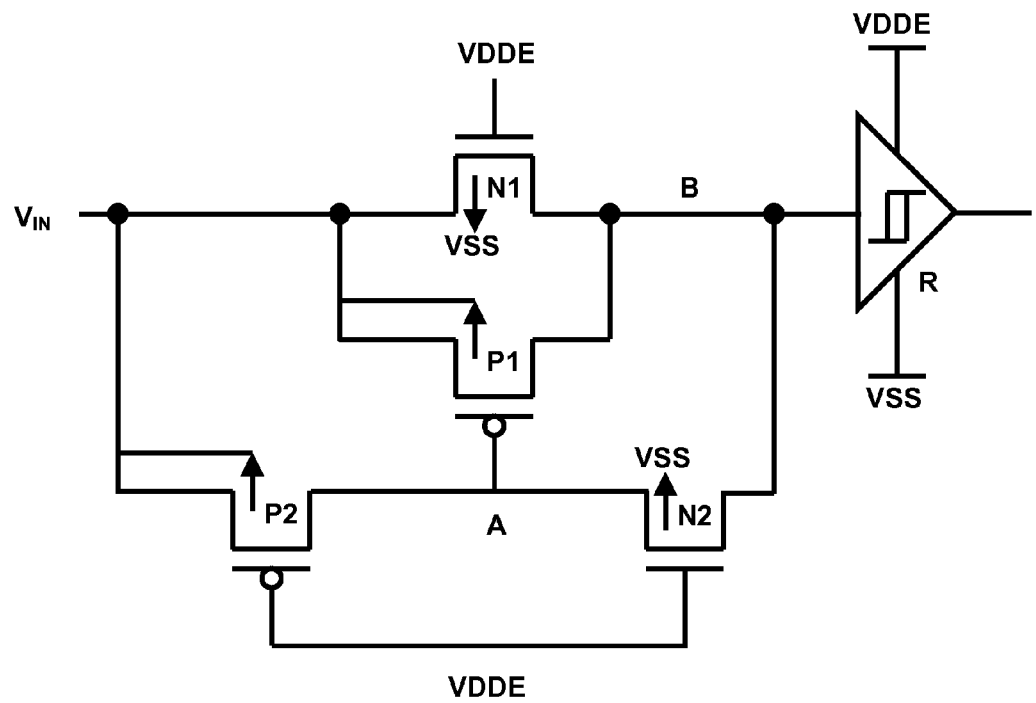
FIG. 1 shows a circuit diagram of a voltage tolerant input circuit according to a first embodiment.

FIG. 1 shows a circuit diagram of a high a voltage tolerant input unit according to a first embodiment. The high voltage tolerant input unit receives an input voltage $V_{IN}$ and comprises a first and second NMOS transistor N1, N2 and a first and second PMOS transistor P1, P2. The unit is coupled to a receiver R. The first NMOS transistor N1 constitutes a simple pass transistor which is connected between the input $V_{IN}$ and a node B, which corresponds to the input of the receiver R. The gate of the NMOS transistor N1 is coupled to VDDE. The first PMOS transistor P1 is coupled in parallel to the first NMOS transistor N1 and its gate is connected to a node A. The second NMOS transistor N2 is connected between the node A and the node B, wherein its gate is coupled to the supply voltage VDDE. The second PMOS transistor P2 is coupled between the input $V_{IN}$ and the node A, wherein its gate is coupled to VDDE. The substrates of the NMOS transistors N1, N2 are coupled to VSS and the substrates of the PMOS transistors P1, P2 are coupled to $V_{IN}$, i.e. the input signal.

For example, if the input signal V.sub.IN has a range from 0 V to VDDE–$V_{TN}$ ($V_{TN}$ being the threshold voltage of the NMOS transistors), the pass transistor N1 is switched on and the input signal $V_{IN}$ is passed to the node B without being attenuated. The second PMOS transistor P2 remains off and the second NMOS transistor N2 is switched on and couples the node A and the node B.

If the input signal $V_{IN}$ has in input signal range from VDDE−$V_{TN}$ to VDDE+$V_{TP}$ ($V_{TP}$ corresponds to the threshold voltage of the PMOS transistor), the first pass transistor N1 is turned off and the second PMOS transistor P2 is still switched off and the node B remains at VDDE−$V_{TN}$. However, as soon as the voltage at node A reaches VDDE−$V_{TN}$, the second NMOS transistor N2 is turned off and the voltage at the node A is at VDDE−$V_{TN}$. If the bodies of the NMOS transistors are affected but the body of the PMOS transistors are not affected, the threshold voltage $V_{TN}$ is higher than the threshold voltage $V_{TP}$. The first PMOS transistor P1 will remain switched off if the input signal is smaller than (VDDE+$V_{TP}$p)−$V_{TN}$. The first PMOS transistor P1 is however turned on if the input signal $V_{IN}$ rises above (VDDE+$V_{TP}$)−$V_{TN}$. Now, the input signal $V_{IN}$ is passed to the node B without an attenuation and the input signal is passed to the input (node B) of the receiver (R). In other words, even at lower supply voltages, the input signal is switched safely to the input node (node B) of the receiver.

If the input signal $V_{IN}$ has a signal range of greater than VDDE+$V_{TP}$, the first and second NMOS transistors N1, N2 will remain switched off while the second PMOS transistor P2 is switched on such that the voltage at the node A is risen to the voltage level of the input signal $V_{IN}$. As soon as the voltage at node A has reached the input signal $V_{IN}$, the first PMOS transistor P1 is turned off such that any further increase in the voltage level of the input signal $V_{IN}$ is not passed to the input (node B) of the receiver. Accordingly, the voltage level at the node B will remain to VDDE+$V_{TP}$ such that the receiver circuit is protected from any high input voltages.

Figure 2:
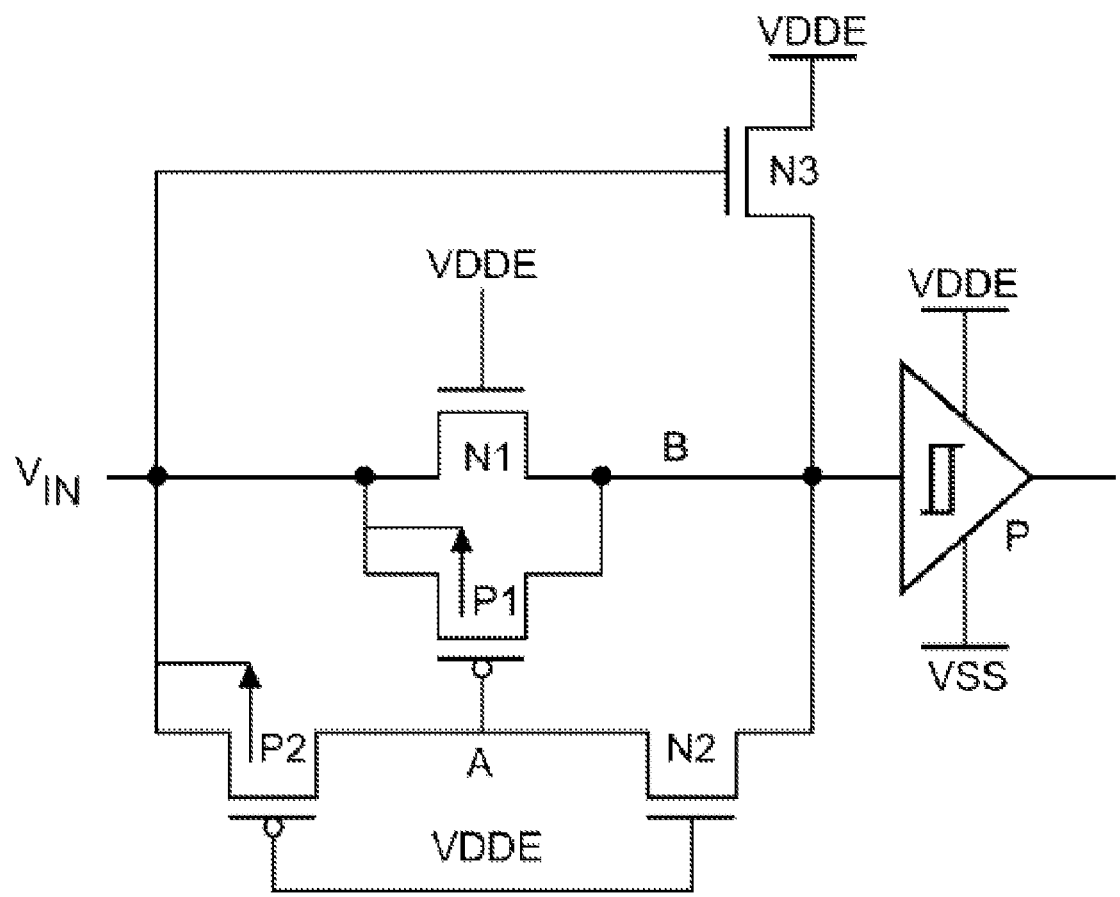
FIG. 2 shows a circuit diagram of a high voltage tolerant input unit according to a second embodiment.

FIG. 2 shows a circuit diagram of a high voltage tolerant unit according to a second embodiment. The high voltage tolerant input unit receives an input signal $V_{IN}$ and comprises a node B which corresponds to the input of the receiver R. The high voltage tolerant input unit according to FIG. 2 substantially corresponds to the high voltage tolerant input unit according to FIG. 1 but additionally comprises a third NMOS transistor N3 which is coupled between the supply voltage VDDE and the node B, while its gate is coupled to the input signal $V_{IN}$. With the provision of the additional third NMOS transistor N3 the overstressing of the device can be reduced to the device limiting voltage level. Hence, the third NMOS transistor N3 serves as a clamping transistor.

If the input signal $V_{IN}$ is of a range between 0 V and VDDE, the third NMOS transistor N3 is switched off and thus does not influence the normal operation. However, if the input signal $V_{IN}$ is more than VDDE+$V_{TN}$, the third NMOS transistor N3 will clamp the signal at the node B to the level of the supply voltage VDDE. Accordingly, the overstress problem for higher supply voltages can be dealt with. Therefore, the input signal $V_{IN}$ (0 V to VDDE) will correspond to the voltage at the node A. Furthermore, the first PMOS transistor P1 and the first NMOS transistor N1 will be switched off such that no static current is present in the circuit.

Accordingly, the circuit according to FIG. 2 allows an operation for a wide range of input signals and the provision of a high voltage tolerant unit without static current.

Figure 3:
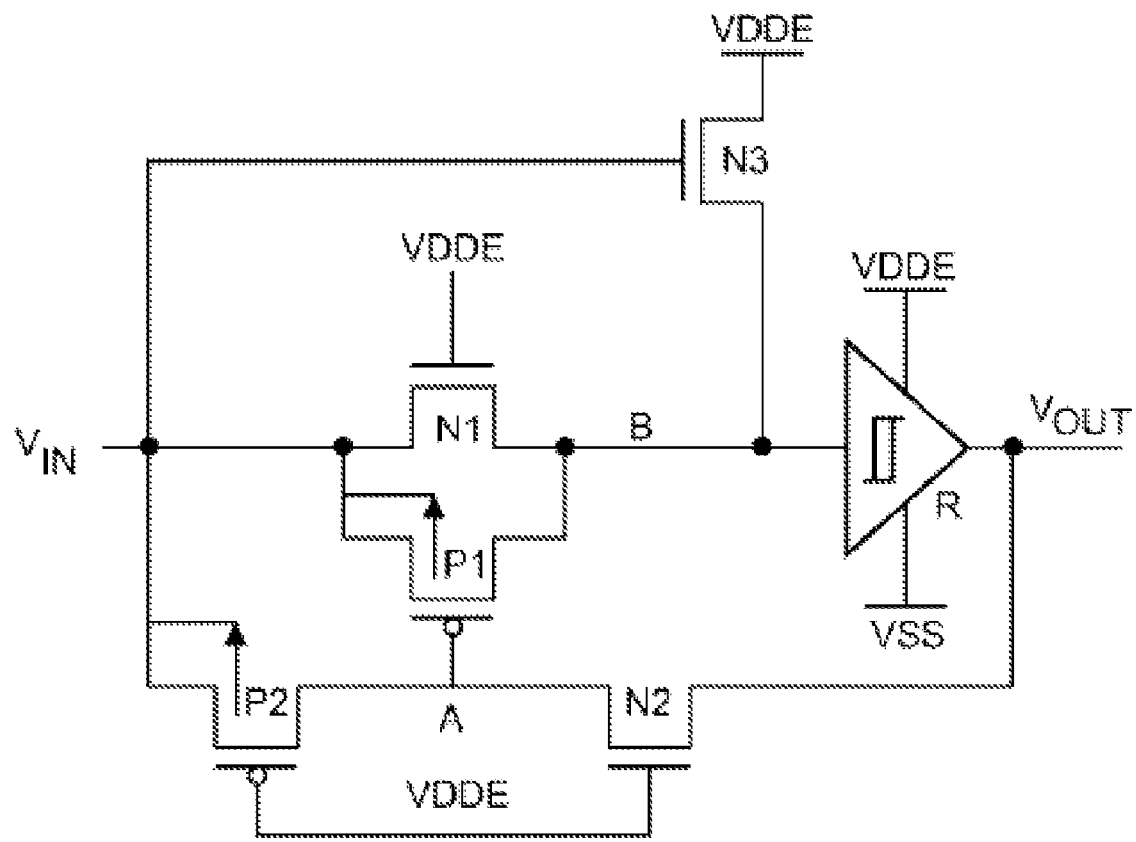
FIG. 3 shows a circuit diagram of a high voltage tolerant input unit according to a third embodiment.

FIG. 3 shows a circuit diagram of a high voltage tolerant unit according to a third embodiment. The high voltage tolerant input unit according to FIG. 3 substantially corresponds to the high voltage tolerant input unit according to FIG. 2 wherein the second NMOS transistor N2 is not coupled to the node B but to the output of the receiver R. This will lead to the situation that the output signal $V_{OUT}$ is of the same polarity as the voltage at node B.

The high voltage tolerant input units according to the first, second and third embodiment may be used in any electronic devices with a need of high voltage tolerant units which also include a low voltage operation. Therefore, the high voltage tolerant input unit according to the first, second or third embodiment may be used for an input buffer of an IO circuit. Furthermore, the high voltage tolerant unit according to the first, second or third embodiment may also be used in circuits which need an interoperability to different voltages. Moreover, the high voltage tolerant units according to the first, second or third embodiment can also be used in a bridging circuit between two voltage domains.

Figure 4:
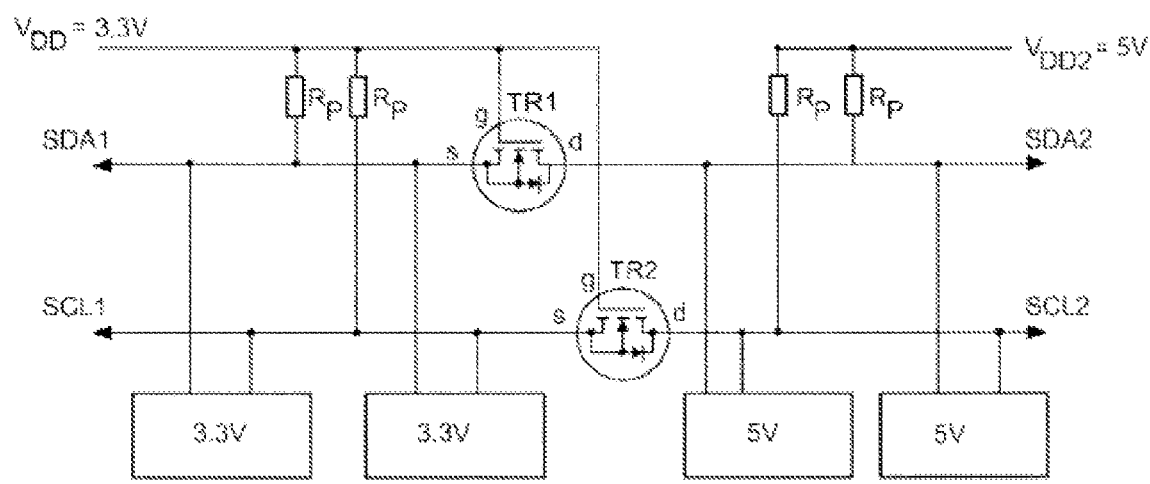
FIG. 4 shows a block diagram of an electronic device according to a fourth embodiment.

FIG. 4 shows a block diagram of an electronic device according to a fourth embodiment. The electronic device comprises devices which are operated at 3.3 V and devices which are operated at 5 V. Here, a bi-directional level shifter is shown which is able to connect to different voltage sections in an I2C bus system. In particular, the high voltage tolerant input unit according to the first, second or third embodiment may be used in a bridging circuit. The low voltage process technology transistors TR1, TR2 can be replaced by the high voltage tolerant input units according to the first, second or third embodiment. For more details on the bidirectional level shifter, please refer to U.S. Pat. No. 5,689, 196 which is incorporated by reference.

According to the invention, a circuit with a simple NMOS pass transistor is able to pass an input signal with a range from 0 V to VDDE−$V_{TH}$ to the input of a receiver. Here, two problems may arise, namely the PMOS transistor in the receiver will not shut off completely leading to a static current leakage if the input signal is high. Furthermore, if the voltage VDDE is small, the input signal to the receiver VDDE−$V_{TH}$ may not be sufficient to switch the receiver state. These two problems can be coped with by taking care that the input signal at the receiver reaches VDDE. This can be achieved by a circuit which enables that if the input is small or equal VDDE, then the output of the circuit will correspond to the input. However, if the input signal is larger than VDDE, then the output of the circuit will correspond to VDDE. This is achieved according to the first, second and third embodiments.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be constrained as limiting the scope of the claims.

The invention claimed is:

1. An electronic device comprising:
a high voltage tolerant circuit having:
an input terminal for receiving an input signal,
a first node and a second node, wherein the second node is coupled to an input of a receiver,
a first NMOS transistor and a first PMOS transistor coupled in parallel between the input terminal and the second node, a second PMOS transistor coupled between the input terminal and the first node, and a second NMOS transistor coupled with one of its terminals to the first node, wherein the gate of the first NMOS transistor is coupled to a supply voltage, wherein the gate of the first PMOS transistor is coupled to the first node, wherein the gate of the second NMOS transistor and the gate of the second PMOS transistor are coupled to the supply voltage, a third NMOS transistor coupled between the supply voltage and the second node, wherein the gate of the third NMOS transistor is coupled to the input terminal, wherein the second terminal of the second NMOS transistor is coupled to the second node.

2. An electronic device comprising:

a high voltage tolerant circuit having:

an input terminal for receiving an input signal, a first node and a second node, wherein the second node is coupled to an input of a receiver, a first NMOS transistor and a first PMOS transistor coupled in parallel between the input terminal and the second node, a second PMOS transistor coupled between the input terminal and the first node, and a second NMOS transistor coupled with one of its terminals to the first node, wherein the gate of the first NMOS transistor is coupled to a supply voltage, wherein the gate of the first PMOS transistor is coupled to the first node, wherein the gate of the second NMOS transistor and the gate of the second PMOS transistor are coupled to the supply voltage, a third NMOS transistor coupled between the supply voltage and the second node, wherein the gate of the third NMOS transistor is coupled to the input terminal.

3. The electronic device according to claim 2, wherein a second terminal of the second NMOS transistor is coupled to the output of the receiver.

4. A circuit comprising:

an input terminal configured to receive an input signal, the input signal changing over a voltage range including a first voltage range and a second voltage range higher than the first voltage range;

an output terminal coupled to an electronic component;

a first transistor between the input terminal and the output terminal and configured to turn on to pass the input signal from the input terminal to the output terminal responsive to a voltage level of the input signal being in the first voltage range;

a second transistor between the input terminal and the output terminal, coupled in parallel to the first transistor, and configured to turn on responsive to the voltage level of the input signal exceeding the second voltage range;

a third transistor in a signal path between the input terminal and the output terminal, the first transistor configured to turn off and the third transistor configured to turn on responsive to the input signal exceeding a supply voltage by at least a threshold voltage level of the third transistor configured to turn off the second transistor and to prevent a voltage level at the output terminal from exceeding a first predetermined voltage limit; and a fourth transistor in the signal path between the third transistor and the output terminal, the fourth transistor configured to turn off responsive to a voltage level in a node in the signal path between the third transistor and the fourth transistor increasing above a second predetermined voltage limit.

5. The circuit of claim 4, wherein the first transistor and the fourth transistor are NMOS transistors.

6. The circuit of claim 4, wherein the second transistor and the third transistor are PMOS transistors.

7. The circuit of claim 4, wherein:

the first transistor and the second transistor are coupled in parallel between the input terminal and the output terminal, the third transistor is coupled between the input terminal and the node in the signal path between the third transistor and the fourth transistor, the fourth transistor having one of its terminals coupled to the node in the signal path between the third transistor and the fourth transistor, wherein the gate of the first transistor is coupled to a supply voltage, the gate of the second transistor is coupled to the node in the signal path between the third transistor and the fourth transistor, and the gate of the fourth transistor and the gate of the third transistor is coupled to the supply voltage, and a fifth transistor is coupled between the supply voltage and the a first terminal of the fourth transistor, wherein the gate of the fifth transistor is coupled to the input terminal, and the second terminal of the fourth transistor being coupled to the node in the signal path between the third transistor and the fourth transistor.

8. The circuit of claim 4, wherein the first voltage range is 0 V to the supply voltage minus a threshold voltage level of at least one of the first, fourth, or fifth transistors.

9. The circuit of claim 4, wherein the second voltage range is the supply voltage minus a threshold voltage level of at least one of the first, fourth, or fifth transistors to the supply voltage plus a threshold voltage level of at least one of the second transistor or the threshold voltage level of the third transistor minus the threshold voltage level of at least one of the first, fourth, or fifth transistors.

10. The circuit of claim 9, wherein the first predetermined voltage limit is the supply voltage plus the threshold voltage level of at least one of the second transistor or the threshold voltage level of the third transistor.

11. The circuit of claim 9, wherein the second predetermined voltage limit is the supply voltage minus the threshold voltage level of at least one of the first, fourth, or fifth transistors.

12. A method for providing an interface to multiple voltage domains in an electronic device, the method comprising:

at an input terminal configured to receive an input signal, the input signal changing over a voltage range including a first voltage range and a second voltage range higher than the first voltage range;

passing, using a first transistor between the input terminal and an output terminal, the input signal from the input terminal to the output terminal responsive to a voltage level of the input signal being in the first voltage range;

passing, using a second transistor between the input terminal and the output terminal, the input signal from the input terminal to the output terminal, responsive to the voltage level of the input signal exceeding the second voltage range; and limiting, by using a third transistor to turn off the second transistor, a voltage level at the output terminal from exceeding a first predetermined voltage limit, the third transistor configured to turn on and the first transistor configured to turn off responsive to the voltage level of the input signal exceeding a supply voltage by at least a threshold voltage level of the third transistor.

13. The method of claim 12, wherein the first is an NMOS transistors.

14. The method of claim 12, wherein the second and third transistors are PMOS transistors.

15. The circuit of claim 12, wherein the first voltage range is 0 V to the supply voltage minus a threshold voltage level of the first transistor.

16. The circuit of claim 12, wherein the second voltage range is the supply voltage minus a threshold voltage level of the first transistor to the supply voltage plus a threshold voltage level of at least one of the second transistor or the threshold voltage level of the third transistor minus the threshold voltage level of the first transistor.

17. The circuit of claim 16, wherein the first predetermined voltage limit is the supply voltage plus the threshold voltage level of at least one of the second transistor or the threshold voltage level of the third transistor.

18. The circuit of claim 16, wherein the second predetermined voltage limit is the supply voltage minus the threshold voltage level of the first transistor.

* * * * *